US011874768B1

(12) United States Patent
Steger

(10) Patent No.: US 11,874,768 B1
(45) Date of Patent: Jan. 16, 2024

(54) FLASH MEMORY EMULATION

(71) Applicant: XILINX, INC., San Jose, CA (US)

(72) Inventor: Daniel Steger, Santa Clara, CA (US)

(73) Assignee: XILINX, INC., San Jose, CA (US)

(*) Notice: Subject to any disclaimer, the term of this patent is extended or adjusted under 35 U.S.C. 154(b) by 701 days.

(21) Appl. No.: 16/684,477

(22) Filed: Nov. 14, 2019

(51) Int. Cl.
*G06F 12/02* (2006.01)
*G06F 12/10* (2016.01)
*H03K 19/177* (2020.01)
*H03K 19/1776* (2020.01)
*H03K 19/17736* (2020.01)

(52) U.S. Cl.
CPC .......... *G06F 12/0246* (2013.01); *G06F 12/10* (2013.01); *H03K 19/1776* (2013.01); *H03K 19/17744* (2013.01)

(58) Field of Classification Search
CPC ............. G06F 12/0246; G06F 11/1068; G06F 2212/206; H03K 19/17744; H03K 19/1776
USPC ............... 711/103, E12.019, 206; 710/8, 62; 712/14; 706/22; 703/24, 25; 365/185.33
See application file for complete search history.

(56) References Cited

U.S. PATENT DOCUMENTS

| | | | | |
|---|---|---|---|---|
| 10,642,747 | B1* | 5/2020 | Jagtap | G06F 12/10 |
| 2009/0172247 | A1* | 7/2009 | Bar-Or | G11C 16/10 |
| | | | | 711/E12.008 |
| 2010/0211373 | A1* | 8/2010 | Kukreja | G06F 30/331 |
| | | | | 703/14 |
| 2017/0147499 | A1* | 5/2017 | Mohan | G06F 3/0631 |
| 2017/0220252 | A1* | 8/2017 | Slindee | G06F 3/0604 |
| 2019/0114220 | A1* | 4/2019 | Stenfort | G11C 29/52 |
| 2021/0056042 | A1* | 2/2021 | Arora | G06F 12/1027 |

OTHER PUBLICATIONS

Micron Technology Inc., M25P32 Serial Flash Embedded Memory Features, 2013, pp. 1-52.
Prodromakis, MLC NAND Flash memory: Aging effect and chip/channel emulation, Microprocessors and Microsystems, vol. 39, Issue 8, Nov. 2015, pp. 1052-1062.

* cited by examiner

*Primary Examiner* — Sanjiv Shah
*Assistant Examiner* — Edward Waddy, Jr.
(74) *Attorney, Agent, or Firm* — Crawford Maunu PLLC

(57) ABSTRACT

Disclosed approaches for emulating flash memory include storage circuits having respective address decoders. An input-output circuit has pins compatible with a flash memory device and is configured to input flash commands and output response signals via pins. An emulator circuit is configured to translate each flash command into one or more storage-circuit commands compatible with one storage circuit of the storage circuits, and to generate response signals compatible with the flash memory device. A translator circuit is configured to map a flash memory address in each flash command to an address of the one storage circuit, and to transmit the one or more storage-circuit commands and address to the one storage circuit.

18 Claims, 6 Drawing Sheets

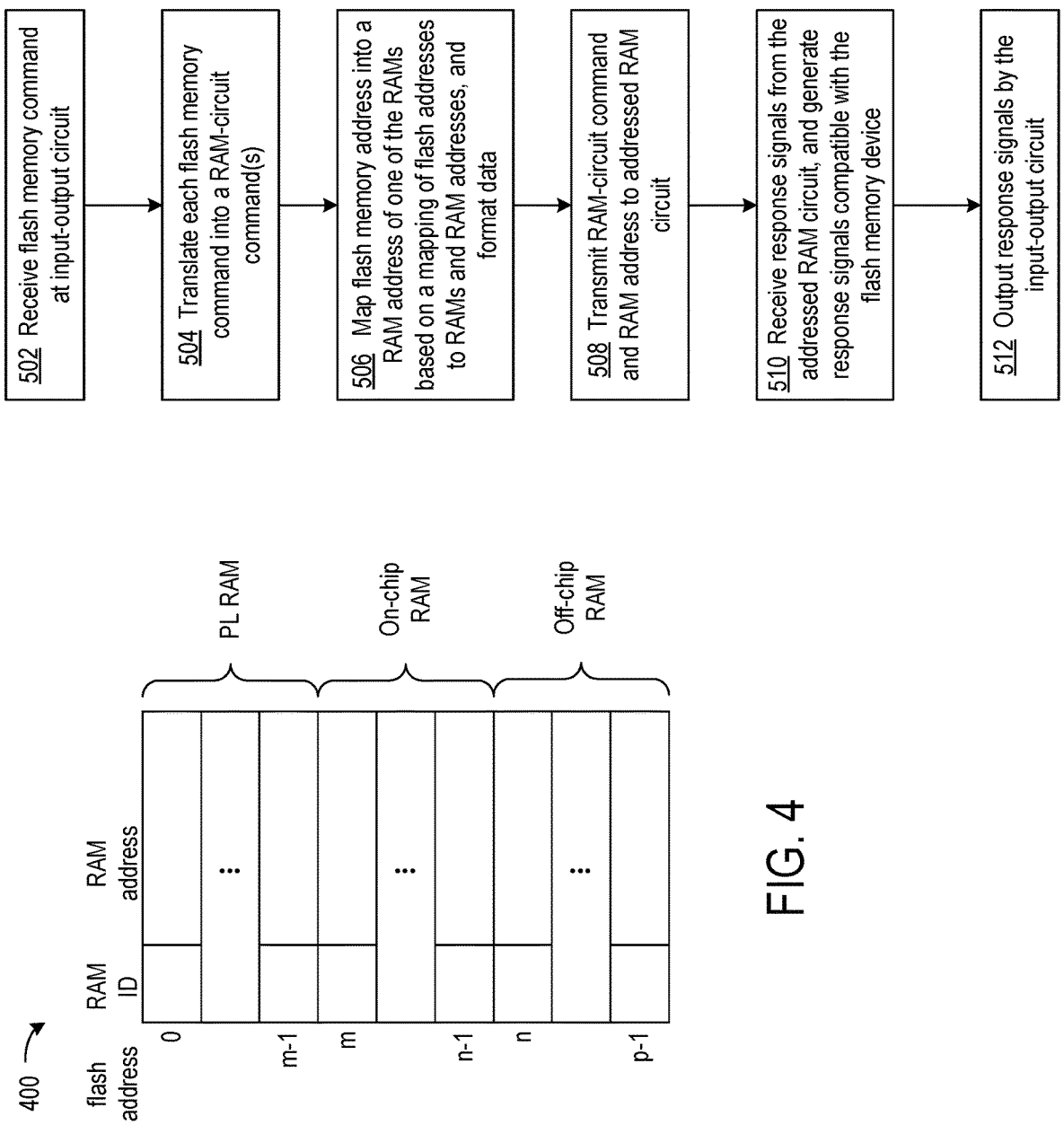

FLASH MEMORY EMULATION

TECHNICAL FIELD

The disclosure generally relates to emulating flash memory devices.

BACKGROUND

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from a memory external to the FPGA or written into the FPGA by an external device. The collective states of the individual memory cells then determine the function of the FPGA. FPGAs can also additionally have eFuses that can be configured for partial customization. For example, the eFuses of an FPGA can be configured to support security features, such as decryption and authentication.

FPGAs are often integrated into systems having flash memories that store the configuration data. In booting an FPGA, the FPGA reads configuration data from the flash memory and loads the configuration data into its configuration memory cells. Thus, FPGAs have integrated interface circuitry for reading from flash memory.

The eFuses of an FPGA are sometimes configured prior to integration of the FPGA into a system by a customer. To verify correct configuration of the eFuses on the FPGA before integration, the FPGA can be booted with configuration data loaded into the device from a flash memory device. Each customer can require different programming of eFuses, and unique boot images are used to verify the different eFuse configurations. Reconfiguring a flash memory device to test numerous different eFuse configurations can be slow and costly.

Writing new configuration data to a flash memory device can be slower than desired for applications such as testing FPGAs. Writing to flash memory is much slower than writing to SRAM or DRAM. Writing new configuration data for an FPGA can take several minutes. Thus, an environment that supports high volume testing can require numerous flash memory devices and supporting hardware In addition to slow write times, the write endurance of flash memory devices can vary depending on the underlying circuit technology. Some flash memory devices are dependable for only a few hundred write cycles, while other flash memory devices are dependable for over a million write cycles. Thus, a reliable approach for testing proper configuration of eFuses can involve expensive flash memory devices. Reliance on less expensive flash memory devices can lead to unexpected failures or require periodic replacement of flash devices to reduce the risk of failure.

SUMMARY

A disclosed circuit arrangement includes a plurality of storage circuits. The storage circuits have respective address decoders. The circuit arrangement further includes an input-output circuit, an emulator circuit, and a translator circuit. The input-output circuit has control, address, and data pins compatible with a flash memory device. The input-output circuit is configured to input flash commands compatible with the flash memory device via the control, address, and data pins, and to output response signals via the control and data pins. The emulator circuit is coupled to the input-output circuit. The emulator circuit is configured to translate each input flash command from the input-output circuit into one or more storage-circuit commands compatible with one storage circuit of the plurality of storage circuits, and to generate response signals compatible with the flash memory device. The translator circuit is coupled to the emulator circuit. The translator circuit is configured to map a flash memory address in each flash command to an address of the one storage circuit, and to transmit the one or more storage-circuit commands and address to the one storage circuit.

A disclosed method includes inputting flash commands compatible with a flash memory device to an input-output circuit via control, address, and data pins that are compatible with the flash memory device. The method has an emulator circuit translating each input flash command into one or more storage-circuit commands compatible with one storage circuit of a plurality of storage circuits, each of which as a respective address decoder. The method has a translator circuit mapping a flash memory address in each flash command to an address of the one storage circuits, transmitting the one or more storage-circuit commands and address to the one storage circuit, and receiving response signals from the one storage circuit. The emulator circuit generates response signals compatible with the flash memory device in response to the response signals, and the input-output circuit outputs the response signals via the control and data pins.

Other features will be recognized from consideration of the Detailed Description and Claims, which follow.

BRIEF DESCRIPTION OF THE DRAWINGS

Various aspects and features of the circuits and methods will become apparent upon review of the following detailed description and upon reference to the drawings in which:

FIG. 4 shows an exemplary address translation map that can be used by a translator circuit to map flash memory addresses to address in the RAM circuit(s) that emulate the address space of the flash memory device;

FIG. 5 shows a flowchart of an exemplary process of emulating a flash memory device by an SoC;

DETAILED DESCRIPTION

Figure 1:
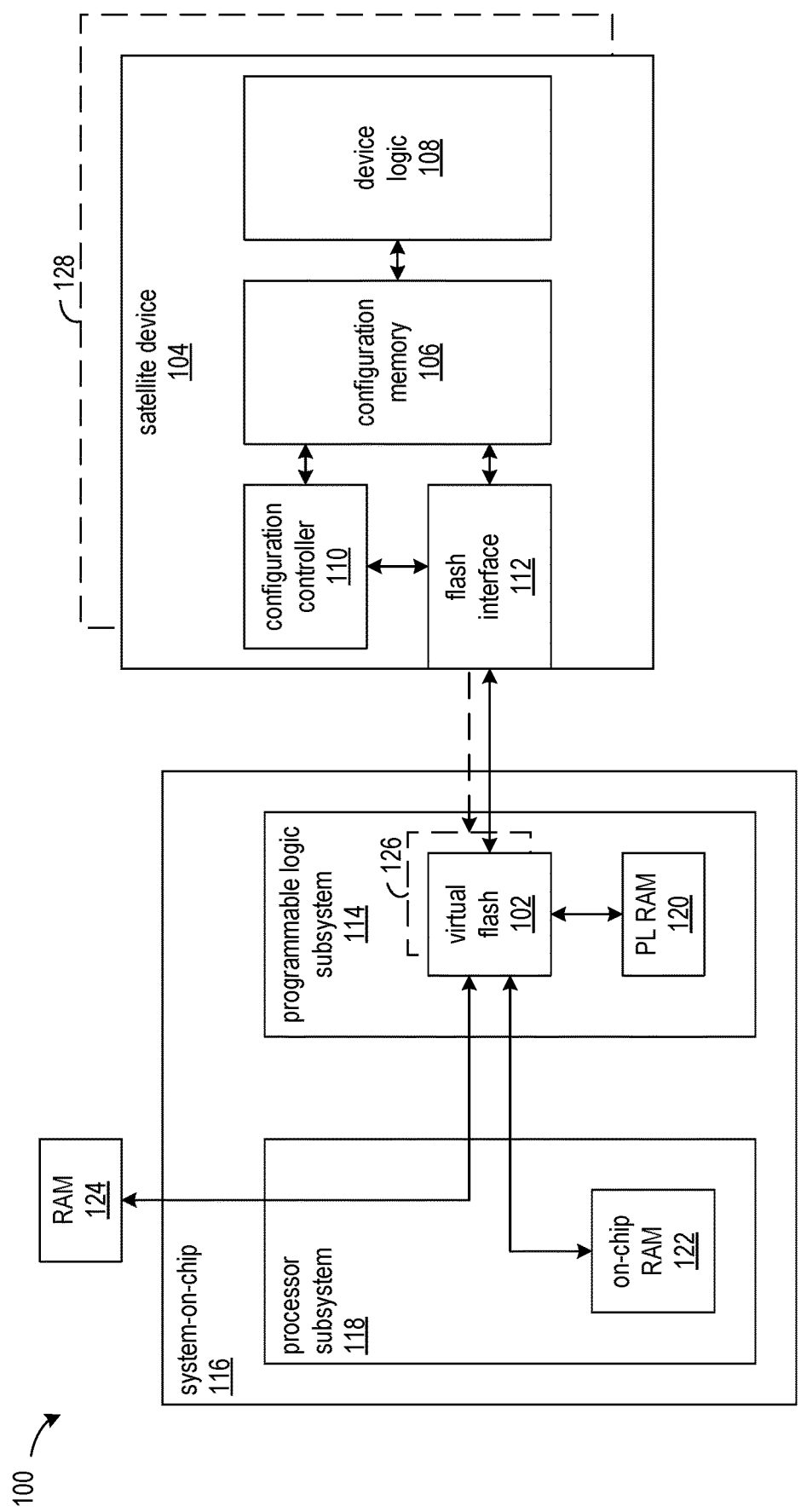
FIG. 1 shows an electronic system in which a flash memory device is emulated by circuitry of an SoC.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed approaches provide circuitry and methods for emulation of a flash memory device. The approaches can be especially useful for storing boot data and booting satellite devices with the boot data. The storage provided by multiple storage circuits can be aggregated into a single address space of the emulated flash memory device, and a virtual flash circuit can emulate input and output of the flash memory device in accessing the multiple storage circuits. In one approach, the storage circuits and the virtual flash circuit can be implemented as circuitry of a system-on-chip (SoC) or system-in-package (SiP). For ease of reference, SoC is used to refer to both a system-on-chip and a system-in-package.

The virtual flash circuit can include an input-output circuit, an emulator circuit, and a translator circuit. The input-output circuit can be configured to provide a pin-compatible interface for receiving flash commands compatible with the flash memory device and outputting flash-compatible response signals. The emulator circuit can be configured to translate the input flash commands into one or more storage-circuit commands compatible with one or more of the storage circuits and generate response signals compatible with the flash memory device. The translator circuit can be configured to map flash memory addresses in the storage-circuit commands to addresses of one or more of the storage circuits and transmit the storage-circuit commands and address to the storage circuits.

FIG. 1 shows an electronic system 100 in which a flash memory device is emulated by circuitry of an SoC. The system generally includes a satellite device 104 and an SoC 116. The satellite device is conventionally configured to boot from a flash memory device (not shown). Instead of a flash memory device, the SoC is configured to emulate the flash memory device, employing multiple storage circuits, such as random access memories (RAMs) on and off the SoC and interface circuitry implemented in programmable logic of the SoC.

The satellite device can include configuration memory 106 and device logic 108, configuration controller 110, and flash interface 112. The device logic can be programmable logic circuitry and/or a processor, and functions implemented by device logic 108 can be configured by data in the configuration memory 106. The configuration controller directs loading of configuration data from a flash memory device through the flash interface. The satellite device can be any electronic device that boots from a flash memory device, including, but not limited to a microcontroller, an FPGA, or an SoC, for example.

The SoC 116 is configured to emulate a target flash memory device for configuring the satellite device 104. The SoC generally includes a programmable logic subsystem 114 and a processor subsystem 118. The programmable logic subsystem is configured to implement a virtual flash circuit 102. The SoC is configured with multiple RAMs 120, 122 and is connected to an external RAM 124, selected ones of which can be configured with configuration data to be loaded into the configuration memory 106 of the satellite device 106. In an exemplary SoC, such as the ZYNC® SoC made by XILINX, Inc., the PL RAM 120 can be implemented as block RAM, c, or LUTRAM, the on-chip RAM 122 can be implemented as on-chip memory or high-bandwidth memory, and the off-chip/device RAM 124 can be DDR RAM modules.

The programmable logic subsystem 114 includes programmable logic circuitry (not shown) that can be configured to implement functions of the virtual flash circuit 102 as specified by data in a configuration memory (not shown). The programmable logic circuitry can include input-output circuitry that is configurable to implement pin interfaces for control, address, and data pins that are compatible with the emulated, target flash memory device.

The processor subsystem 118 includes one or more instruction processors (not shown) and a memory bus for accessing an on-chip RAM 122. The on-chip RAM can be disposed on the same semiconductor IC die as the other circuitry of the processor subsystem and/or programmable logic subsystem 114, or in the same package having multiple semiconductor IC dice.

The virtual flash circuit 102 can employ multiple RAMs for emulating storage of the target flash memory device. That is, the address space of the target flash memory device can be distributed amongst separate address spaces of the multiple RAMs. Each RAM has individual address decoder circuitry for decoding input address signals to that RAM. Storage circuits other than RAMs, such as optical and magnetic storage circuits, could be used in place of or in combination with one or more of the RAMs.

In the exemplary system the multiple RAMs include programmable logic (PL) RAM 120, on-chip RAM 122, and RAM 124. The PL RAM can be implemented by a collection of look-up table (LUT) RAM circuits implemented by the programmable logic circuitry. RAM circuits other than LUT RAM circuits can include the on-chip RAM 122 and the off-chip RAM 124. As indicated above, the on-chip RAM can be coupled to the memory bus (not shown) of the processor subsystem 118. The external RAM 124 can be disposed off-chip/device relative to the instruction processors of the processor subsystem and is connected to a memory bus of the processor subsystem.

Figure 2:
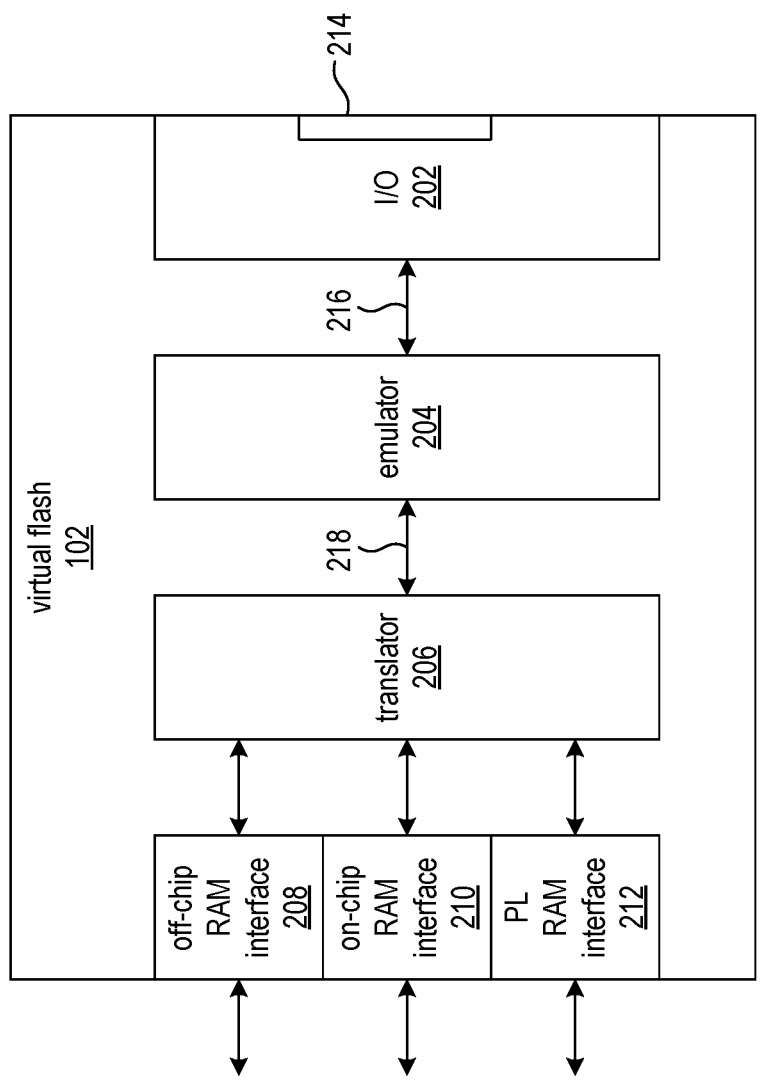
FIG. 2 shows components of a virtual flash circuit.

The virtual flash circuit 102 can include an input-output circuit, an emulator circuit, and a translator circuit (see FIG. 2). The input-output circuit has control, address, and data pins compatible with a flash memory device. The input-output circuit is configured to input flash commands compatible with the flash memory device via the control, address, and data pins. The input-output circuit outputs response signals via the control and data pins. The emulator circuit translates each input flash command from the input-output circuit into one or more RAM-circuit commands compatible with one RAM circuit of the RAM circuits used to emulate the address space of the flash memory device.

The translator circuit maps a flash memory address in each RAM-circuit command to a RAM address of one of the RAM circuits, and transmits each RAM-circuit command and RAM address to the identified RAM circuit. For data to be written to the target flash memory device, the translator circuit reformats the data to the format of the mapped-to RAM circuit. For data read from a mapped-to RAM circuit, the translator circuit reformats the data to the flash format. The emulator circuit generates response signals compatible with the flash memory device.

The system 100 can be configured to emulate multiple flash memory devices. The flash memory devices can be the same (multiple instances of the same type of device) or of different types (e.g., different capacities, pin-outs, makers etc.).

Multiple virtual flash circuits, which are shown as dashed block 126 can be implemented in the programmable logic subsystem 114 of a single SoC 116 to emulate multiple flash memory devices. In an exemplary application, multiple satellite devices, which are shown as dashed block 128, can be configured in parallel through the multiple virtual flash circuits implemented on one SoC.

Using an SoC to emulate a flash memory for configuring and booting satellite devices can reduce costs by eliminating limited-use flash memory devices. The SoC can provide additional security over configuration data and allow a printed circuit board design having a smaller footprint. Loading a configuration data targeted at the satellite device into RAM circuits of the SoC is also much faster than loading data into a flash memory device. In addition, configuration time of the satellite device can be significantly reduced, because the SoC can operate a greater I/O clock rate than the flash memory device and the configuration data can be loaded from the SoC into the satellite device at a much faster rate than loading from a flash memory. The configurability of the SoC allows emulation (parallel or sequential) of flash memory devices having different storage capacities, and the I/O voltages of the SoC are configurable to support compatibility with various flash memory devices.

FIG. 2 shows components of a virtual flash circuit 102. The virtual flash circuit includes an input-output (I/O) circuit 202, an emulator circuit 204, a translator circuit 206, and memory interface circuits, for example, off-chip RAM interface 208, on-chip RAM interface 210, and PL RAM interface 212, for accessing different RAM circuits.

The I/O circuit 202 has pins 214 that are compatible with a target flash memory device. The pins can include pins for control signals, address signals, and data signals. Over the I/O pins, the I/O circuit inputs flash memory access commands that are compatible with the target flash memory device. Response signals are output via the control pins and data pins.

The emulator circuit 204 is coupled between the I/O circuit 202 and the translator circuit 206. The emulator circuit receives control, address, and data signals from the I/O circuit via signal lines 216 and translates each input flash command from the I/O circuit into one or more RAM-circuit commands that are compatible with one of the RAM circuits, such as one of RAM circuits 120, 122, 124 (FIG. 1). The RAM circuit commands generated by the emulator circuit include control, address and data signals and can be provided to the translator circuit on signal lines 218. The emulator circuit negotiates communication with the satellite device. For example, the emulator circuit can negotiate the communication bus width. In addition, the emulator circuit receives a clock signal from the satellite device and outputs response signals to the satellite device accordingly. In response to control and data signals received from the RAM circuits through the translator circuit, the emulator circuit generates response signals compatible with the flash memory device and provides the response signals to the I/O circuit 202 for output.

In response to RAM-circuit commands from the emulator circuit, the translator circuit maps flash memory addresses to a RAM address of the one RAM circuits 120, 122, 124 (FIG. 1). For memory write commands, the translator circuit reformats data from flash format to the format provided by the identified RAM circuit. For memory read commands, the translator circuit reformats data from the format of the identified RAM circuit to flash format. Once the RAM-circuit address has been determined, the RAM-circuit command, RAM-circuit address, and reformatted data (for write requests) can be transmitted to the referenced one of the RAM circuit via one of the interface circuits 208, 210, or 212.

Figure 3:
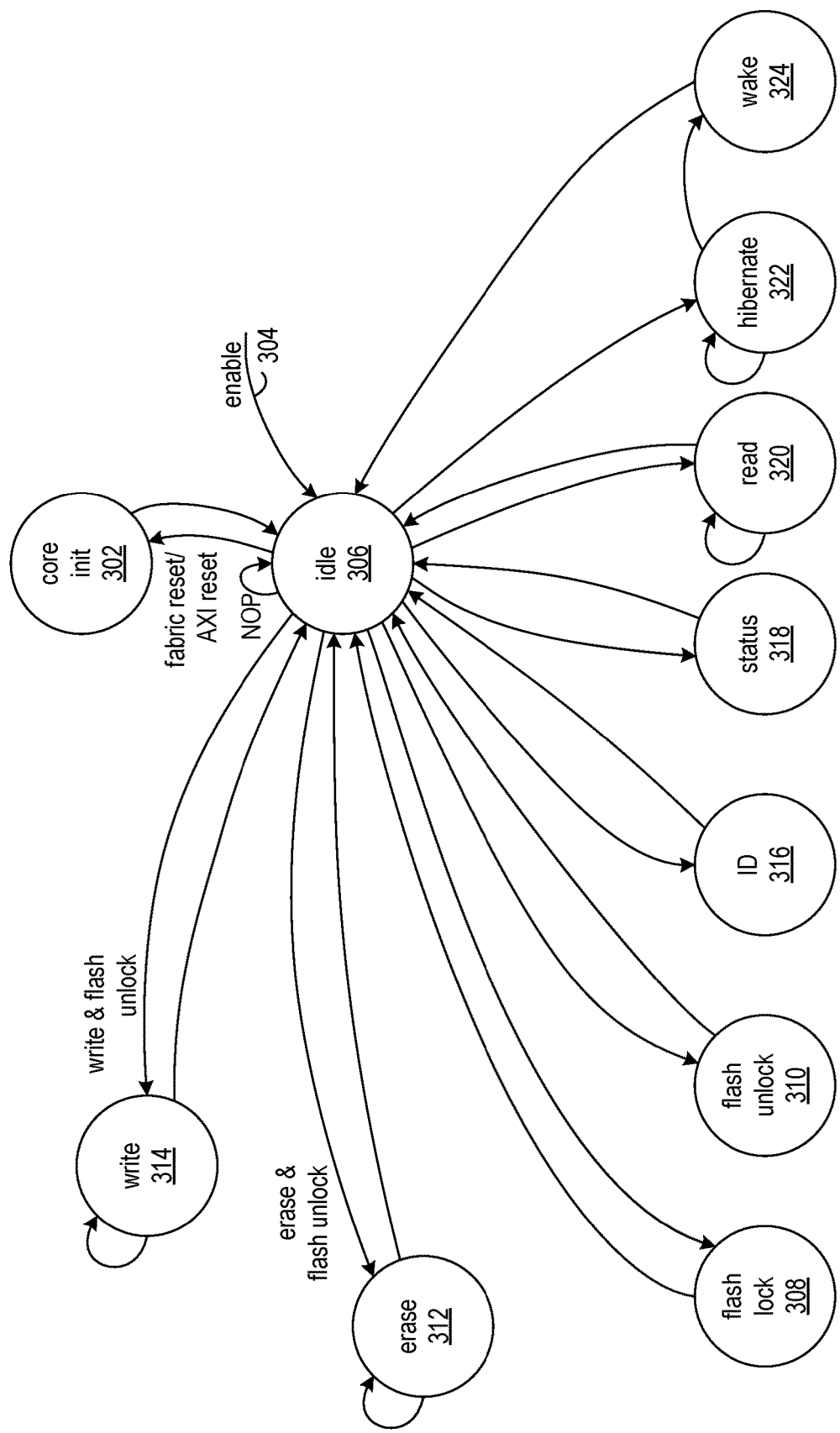
FIG. 3 shows a state diagram describing the emulator circuit of FIG. 2.

FIG. 3 shows a state diagram describing the emulator circuit 204 of FIG. 2. In the core initialization state 302, the emulator circuit, in response to a flash memory device reset signal, resets state machines into an initial state and performs a self-test. Once initialized, the emulator circuit transitions to idle state 306, which is enabled to input a flash memory command in response to enable signal 304. The emulator circuit can transition from idle state 306 back to core initialization state 302 in response to a reset signal. Otherwise, the state to which the emulator circuit transitions depends on the input flash command.

In response to a flash lock command, the emulator circuit transitions to state 308. In response to a lock command, the emulator circuit emulates a locked state of the flash memory device; reading from the emulated flash memory device is allowed, but modification is prevented. The emulator circuit returns to the idle state 306 after performing operations associated with locking the emulated flash memory device on the referenced one of the RAM circuits and generating associated output response signals to the I/O circuit.

In response to a flash unlock command, the emulator circuit transitions to state 310, and emulates an unlocked state by permitting modifications to the emulated flash memory device. After performing operations associated with unlocking the target flash memory device on the referenced one of the RAM circuits, the emulator circuit transitions back to idle state 306. For an erase function in response to an erase signal and flash unlock signal, the emulator circuit transitions to state 312. In state 312, the emulator circuit generates one or more write access requests to the RAM circuit(s) that emulate the address space of the flash memory device, and the data specified by in the write access request(s) is equivalent to the data expected to be in the emulated flash memory device after erasing. The emulator circuit returns to the idle state 306 after performing operations associated with erasing the emulated flash memory device and generating associated output response signals to the I/O circuit.

For a write function, the emulator circuit transitions to write state 314 in response to a write signal and flash unlock signal. In state 314, the emulator circuit generates one or more write access requests to the RAM circuit(s) that emulate the address space of the flash memory device. The data specified in the write access request(s) is that specified in the unlock-write command. The emulator circuit returns to the idle state 306 after performing operations associated with writing to the emulated flash memory device and generating associated output response signals to the I/O circuit.

In response to a flash ID command, the emulator circuit transitions to state 316, and the emulator circuit returns information about the emulated flash memory device, such as manufacturer, device type, memory capacity, and factory data, for example. The emulator circuit returns to the idle state 306 after performing operations associated with the ID command and generating associated output response signals to the I/O circuit.

In response to a flash status command, the emulator circuit transitions to state 318, and the emulator circuit emulates reading the status register of the flash memory. The status register can indicate whether a write operation is in progress, the state of a write enable latch, the size of flash memory space protected against program and erase commands, etc. The emulator circuit returns to the idle state 306 after performing operations associated with the status command and generating associated output response signals to the I/O circuit.

In response to a flash read command, the emulator circuit transitions to state 320. In state 320, the emulator circuit generates one or more read access requests to the RAM circuit(s) that emulate the address space of the flash memory device. The emulator circuit returns to the idle state 306 after performing operations associated with the read command and generating associated output response signals to the I/O circuit.

In response to a flash hibernate command, the emulator circuit transitions to state 322, and the emulator circuit can cause certain ones of the PL RAM 12 to be powered-down. For example, in certain FPGA devices having UltraRAM, the control circuitry of the memory circuits can be powered down. Clock gating or other measures can be performed by the emulator circuit to power down selected circuitry. For circuits that cannot be powered down, the emulator circuit can perform a NOP command. The emulator circuit returns to the idle state 306 after performing operations associated with the hibernate command and generating associated output response signals to the I/O circuit, the emulator circuit remains in the hibernate state until a flash wake command is received. In response to a flash wake command, the emulator circuit transitions to state 324, and the emulator circuit enables memory control circuitry if powered-down. The emulator circuit returns to the idle state 306 after performing operations associated with the wake command and generating associated output response signals to the I/O circuit.

In response to a flash command that is incompatible with the RAM circuit(s) that emulates the address range of the emulated flash memory device, the emulator circuit generates a normal output status signal to the I/O circuit, bypassing translation of the flash command into a RAM-circuit command, and remains in state 306.

FIG. 4 shows an exemplary address translation map 400 that can be used by a translator circuit to map flash memory addresses to address in the RAM circuit(s) that emulate the address space of the flash memory device. The address space of the exemplary emulated flash memory device ranges from 0 to p−1, and the entries in the address translation map are referenced by an input flash memory address.

Different ranges of addresses of the emulated flash memory device can be mapped to different ones of the RAM circuits of the SoC. Each entry in the exemplary address translation map includes a RAM ID and a RAM address. The RAM ID indicates which of the multiple RAM circuits of the SoC maps to the emulated flash address. The RAM address indicates the address in the mapped-to RAM circuit. In the exemplary address translation map, flash memory addresses ranging from 0 to m−1 are mapped to PL RAM, flash memory addresses m to n−1 are mapped to on-chip RAM, and flash memory addresses n to p−1 are mapped to off-chip RAM.

FIG. 5 shows a flowchart of an exemplary process of emulating a flash memory device by an SoC. At block 502, a virtual flash circuit implemented on an SoC inputs flash memory commands from a satellite device via an I/O circuit that is signal-level compatible with the emulated flash memory device.

At block 504, the virtual flash circuit translates each input flash command received via from the input-output circuit into one or more RAM-circuit commands compatible with one RAM circuit of RAM circuits of the SoC. For a flash memory command that is in compatible with the RAM circuits that emulate the flash address space, the virtual flash circuit bypasses translation of the flash command and generates a normal status response signal compatible with the emulated flash memory device.

At block 506, the virtual flash circuit maps a flash memory address in each RAM-circuit command to a RAM address of the one RAM circuits. The virtual flash circuit can further map a byte-level flash memory address command to a byte-level RAM address of a RAM circuit. The virtual flash circuit reformats data as may be needed. For data to be written to a RAM circuit, the virtual flash circuit reformats the data from a flash format to the data format of the mapped-to RAM circuit. For data read from a mapped-to RAM circuit, the virtual flash circuit reformats the data from the format of the RAM circuit to the format of the emulated flash memory device.

The virtual flash circuit at block 508 transmits the one or more RAM-circuit commands and RAM address to the RAM circuit to which the flash memory address mapped. At block 510, the virtual flash circuit receives response signals from the RAM circuit and generates response signals that are compatible with the emulated flash memory device. At block 512, the virtual flash circuit outputs the response signals via the flash-compatible control and data pins.

Figure 6:
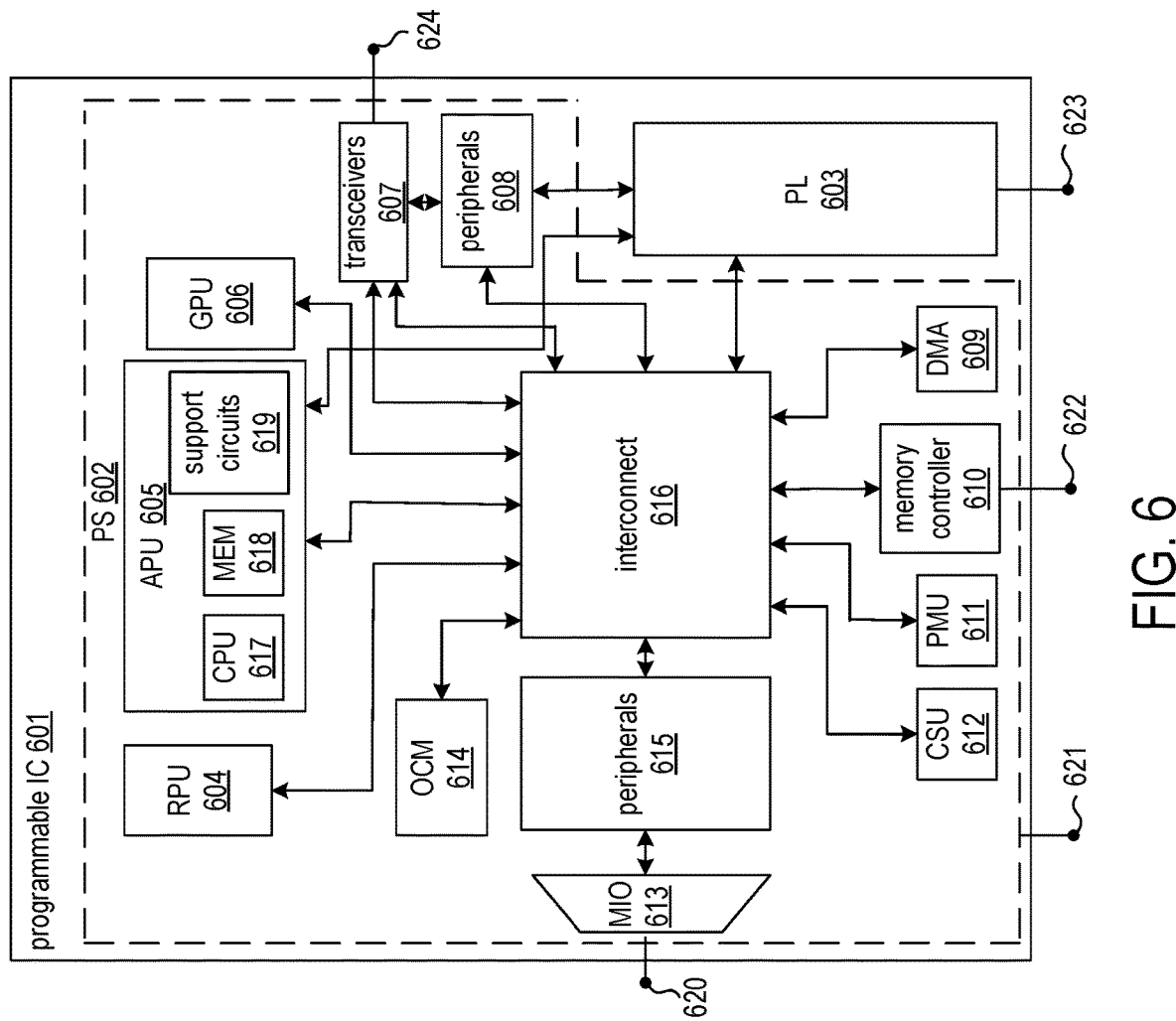
FIG. 6 is a block diagram depicting an SoC that can host the virtual flash circuitry according to an example.

FIG. 6 is a block diagram depicting a System-on-Chip (SoC) 601 that can host the virtual flash circuitry according to an example. In the example, the SoC includes the processing subsystem (PS) 602 and the programmable logic subsystem 603. The processing subsystem 602 includes various processing units, such as a real-time processing unit (RPU) 604, an application processing unit (APU) 605, a graphics processing unit (GPU) 606, a configuration and security unit (CSU) 612, and a platform management unit (PMU) 611. The PS 602 also includes various support circuits, such as on-chip memory (OCM) 614, transceivers 607, peripherals 608, interconnect 616, DMA circuit 609, memory controller 610, peripherals 615, and multiplexed (MIO) circuit 613. The processing units and the support circuits are interconnected by the interconnect 616. The PL subsystem 603 is also coupled to the interconnect 616. The transceivers 607 are coupled to external pins 624. The PL 603 is coupled to external pins 623. The memory controller 610 is coupled to external pins 622. The MIO 613 is coupled to external pins 620. The PS 602 is generally coupled to external pins 621. The APU 605 can include a CPU 617, memory 618, and support circuits 619. The APU 605 can include other circuitry, including L1 and L2 caches and the like. The RPU 604 can include additional circuitry, such as L1 caches and the like. The interconnect 616 can include cache-coherent interconnect or the like.

Referring to the PS 602, each of the processing units includes one or more central processing units (CPUs) and associated circuits, such as memories, interrupt controllers, direct memory access (DMA) controllers, memory management units (MMUs), floating point units (FPUs), and the like. The interconnect 616 includes various switches, busses, communication links, and the like configured to interconnect the processing units, as well as interconnect the other components in the PS 602 to the processing units.

The OCM 614 includes one or more RAM modules, which can be distributed throughout the PS 602. For example, the OCM 614 can include battery backed RAM (BBRAM), tightly coupled memory (TCM), and the like. The memory controller 610 can include a DRAM interface for accessing external DRAM. The peripherals 608, 615 can include one or more components that provide an interface to the PS 602. For example, the peripherals can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose (GPIO) ports, serial advanced technology attachment (SATA) ports, PCIe ports, and the like. The peripherals 615 can be coupled to the MIO 613. The peripherals 608 can be coupled to the transceivers 607. The transceivers 607 can include serializer/deserializer (SERDES) circuits, MGTs, and the like.

Figure 7:
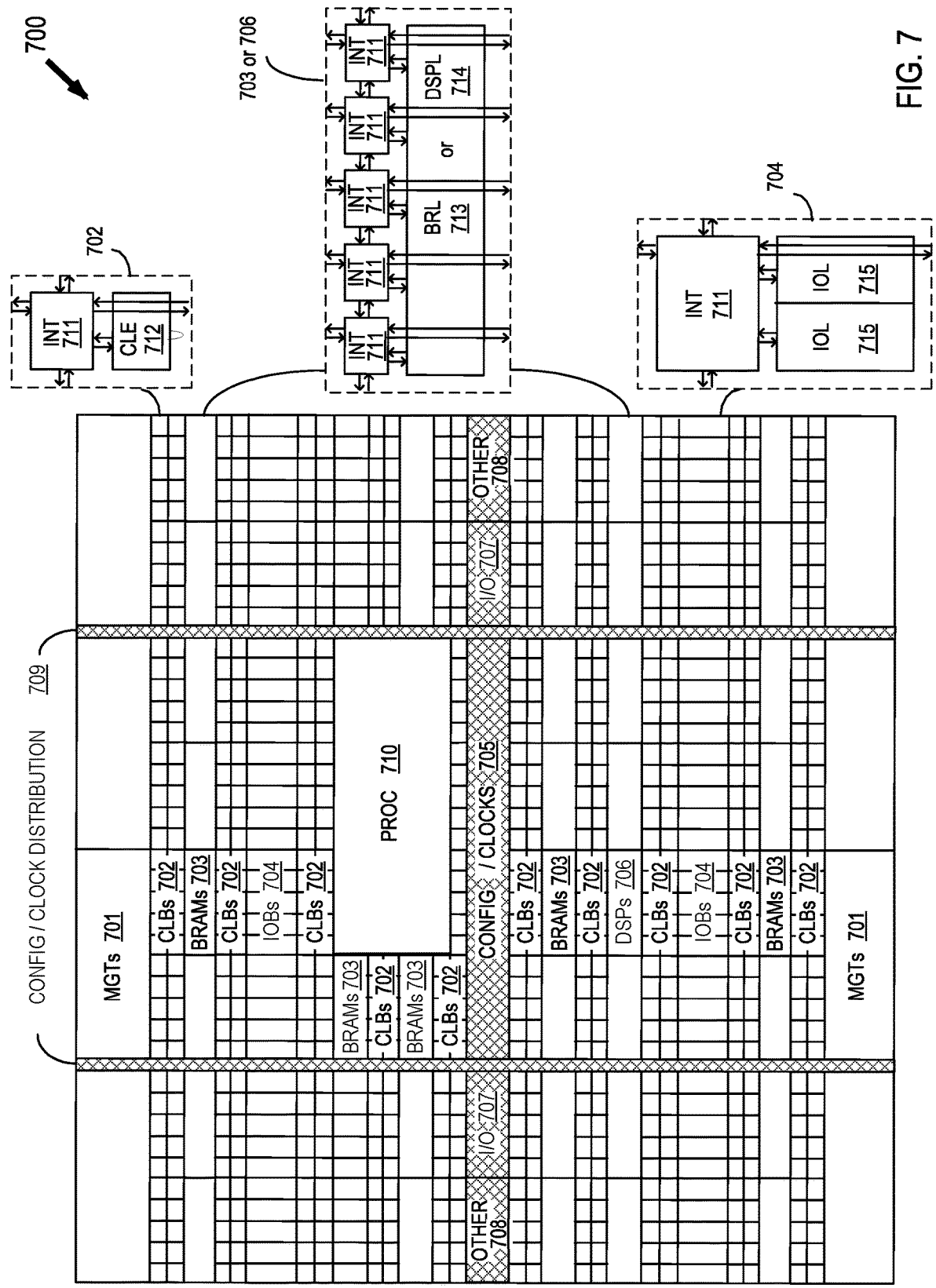
FIG. 7 shows an exemplary programmable integrated circuit (IC) having programmable logic circuitry on which the disclosed circuits and processes can be implemented.

FIG. 7 shows an exemplary programmable integrated circuit (IC) 700 having programmable logic circuitry on which the disclosed circuits and processes can be implemented. The programmable IC may also be referred to as a System On Chip (SOC) that includes field programmable gate array logic (FPGA) along with other programmable resources. FPGA logic may include several different types of programmable logic blocks in the array. For example, FIG. 7 illustrates programmable IC 700 that includes a large number of different programmable tiles including multi-gigabit transceivers (MGTs) 701, configurable logic blocks (CLBs) 702, random access memory blocks (BRAMs) 703, input/output blocks (IOBs) 704, configuration and clocking logic (CONFIG/CLOCKS) 705, digital signal processing blocks (DSPs) 706, specialized input/output blocks (I/O) 707, for example, clock ports, and other programmable logic 708 such as digital clock managers, analog-to-digital converters, system monitoring logic, and so forth. Some programmable IC having FPGA logic also include dedicated processor blocks (PROC) 710 and internal and external reconfiguration ports (not shown). Circuit designs processed according to the disclosed methods and systems can also be implemented as ASICs or on an adaptive compute acceleration platform (ACAP). An ACAP has FPGA fabric with distributed memory and hardware-programmable DSP blocks, a multicore SoC, and one or more software programmable, yet hardware adaptable, compute engines, all connected through a network on chip (NoC).

In some FPGA logic, each programmable tile includes a programmable interconnect element (INT) 711 having standardized connections to and from a corresponding interconnect element in each adjacent tile. Therefore, the programmable interconnect elements taken together implement the programmable interconnect structure for the illustrated FPGA logic. The programmable interconnect element INT 711 also includes the connections to and from the programmable logic element within the same tile, as shown by the examples included at the top of FIG. 7.

For example, a CLB 702 can include a configurable logic element CLE 712 that can be programmed to implement user logic, plus a single programmable interconnect element INT 711. A BRAM 703 can include a BRAM logic element (BRL) 713 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 706 can include a DSP logic element (DSPL) 714 in addition to an appropriate number of programmable interconnect elements. An 10B 704 can include, for example, two instances of an input/output logic element (IOL) 715 in addition to one instance of the programmable interconnect element INT 711. As will be clear to those of skill in the art, the actual I/O bond pads connected, for example, to the I/O logic element 715, are manufactured using metal layered above the various illustrated logic blocks, and typically are not confined to the area of the input/output logic element 715.

A columnar area near the center of the die (shown shaded in FIG. 7) is used for configuration, clock, and other control logic. Horizontal areas 709 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 7 include additional logic blocks that disrupt the regular columnar structure making up a large part of the programmable IC. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The circuits and methods are thought to be applicable to a variety of systems for emulating flash memory devices. Other aspects and features will be apparent to those skilled in the art from consideration of the specification. The circuits and methods can be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A circuit that emulates a flash memory device, comprising:
    a plurality of storage circuits;
    an input-output circuit having control, address, and data pins compatible with a flash memory device, the input-output circuit configured to:
        input flash commands compatible with the flash memory device via the control, address, and data pins, and
        output response signals via the control and data pins;

an emulator circuit coupled to the input-output circuit, the
emulator circuit configured to:
determine whether or not a flash command is compatible with one storage circuit of the plurality of storage circuits;
in response to the flash command being compatible with the one storage circuit:
translate the flash command into one or more storage-circuit commands compatible with the one storage circuit; and
generate a first response signal compatible with the flash memory device to the input-output circuit; and
in response to the flash command being incompatible with the one storage circuit:
bypass translation of the flash command into the one or more storage-circuit commands; and
generate a second response signal compatible with the flash memory device to the input-output circuit; and
a translator circuit coupled to the emulator circuit, the translator circuit configured to, in response to the flash command being compatible with the one storage circuit:
map a flash memory address in the flash command to a storage address of the one storage circuit, and
transmit the one or more storage-circuit commands and storage address to the one storage circuit.

2. The circuit arrangement of claim 1, wherein the translator circuit is further configured to:
reformat data to be written to the one storage circuit from a flash format to a different storage format; and
reformat data read from the one storage circuit from the different storage format to the flash format.

3. The circuit arrangement of claim 1, wherein the input-output circuit, emulator circuit, and translator circuit are implemented in programmable logic circuitry.

4. The circuit arrangement of claim 3, wherein the plurality of storage circuits include a look-up table (LUT) RAM circuit implemented in the programmable logic circuitry and a storage circuit implemented in circuits other than LUTs of the programmable logic circuitry.

5. The circuit arrangement of claim 1, further comprising:
a system-on-chip including a processor subsystem and a programmable logic subsystem;
wherein:
the processor subsystem includes one or more instruction processors and an on-chip memory that is a storage circuit of the plurality of storage circuits;
the programmable logic subsystem includes programmable logic circuitry and programmable logic RAM that is a storage circuit of the plurality of storage circuits; and
the input-output circuit, emulator circuit, and translator circuit are implemented in programmable logic circuitry of the programmable logic subsystem.

6. The circuit arrangement of claim 5, further comprising an off-chip memory circuit that is a storage circuit of the plurality of storage circuits.

7. The circuit arrangement of claim 1, wherein the translator circuit is configured to map a flash memory byte-level address to a byte-level address of the one storage circuit.

8. The circuit arrangement of claim 1, further comprising:
a system-on-chip including a processor subsystem and a programmable logic subsystem;
wherein:
the processor subsystem includes one or more instruction processors and an on-chip memory that is a storage circuit of the plurality of storage circuits;
the programmable logic subsystem includes programmable logic circuitry and programmable logic RAM that is a storage circuit of the plurality of storage circuits;
the translator circuit is configured to:
map a first range of addresses of the flash memory device to RAM addresses of the programmable logic RAM,
map a second range of addresses of the flash memory device to RAM addresses of the on-chip memory; and
the input-output circuit, emulator circuit, and translator circuit are implemented in programmable logic circuitry of the programmable logic subsystem.

9. The circuit arrangement of claim 8, further comprising an off-chip memory circuit that is a storage circuit of the plurality of storage circuits, wherein the translator circuit is configured to map a third range of addresses of the flash memory device to RAM addresses of the off-chip memory circuit.

10. A method that emulates a flash memory device, comprising:
inputting a flash command compatible with a flash memory device to an input-output circuit via control, address, and data pins that are compatible with the flash memory device;
determining, by an emulator circuit, whether or not the flash command is compatible with one storage circuit of a plurality of storage circuits;
in response to the flash command being compatible with the one storage circuit:
translating, by the emulator circuit, the flash command into one or more storage-circuit commands compatible with the one storage circuit;
mapping, by a translator circuit, a flash memory address in the flash command to a storage address of the one storage circuit;
transmitting the one or more storage-circuit commands and storage address from the translator circuit to the one storage circuit;
receiving a first response signal from the one storage circuit at the translator circuit;
generating, by the emulator circuit, a second response signal compatible with the flash memory device in response to the first response signal; and
outputting the second response signal from the input-output circuit via the control and data pins; and
in response to the flash command being incompatible with the one storage circuit:
bypassing translation of the flash command into the one or more storage-circuit commands;
generating, by the emulator circuit, a third response signal compatible with the flash memory device; and
outputting the third response signal from the input-output circuit via the control and data pins.

11. The method of claim 10, further comprising:
reformatting by the translator circuit, data to be written to the one storage circuit from a flash format to a different storage format; and
reformatting by the translator circuit, data read from the one storage circuit from the different storage format to the flash format.

12. The method of claim 10, further comprising implementing the input-output circuit, emulator circuit, and translator circuit in programmable logic circuitry.

13. The method of claim 12, wherein the mapping includes mapping the flash memory address to one of a look-up table (LUT) RAM circuit implemented in the programmable logic circuitry and a storage circuit implemented in circuits other than LUTs of the programmable logic circuitry.

14. The method of claim 10, further comprising:
implementing the input-output circuit, emulator circuit, and translator circuit in programmable logic circuitry of a system-on-chip that includes a processor subsystem and a programmable logic subsystem having the programmable logic circuitry and look-up table (LUT) RAM circuit that is a storage circuit of the plurality of storage circuits, wherein the processor subsystem includes one or more instruction processors and an on-chip memory circuit that is a RAM circuit of the plurality of storage circuits; and
wherein the mapping includes mapping the flash memory address to one of the look-up table (LUT) RAM circuit or the on-chip memory circuit.

15. The method of claim 14, wherein the mapping includes mapping the flash memory address to an off-chip memory circuit.

16. The method of claim 10, further comprising mapping a flash memory byte-level address to a byte-level address of the one storage circuit.

17. The method of claim 10, further comprising:
implementing the input-output circuit, emulator circuit, and translator circuit in programmable logic circuitry of a system-on-chip that includes a processor subsystem and a programmable logic subsystem having the programmable logic circuitry and look-up table (LUT) RAM that is a storage circuit of the plurality of storage circuits, wherein the processor subsystem includes one or more instruction processors and an on-chip memory circuit that is a storage circuit of the plurality of storage circuits; and
wherein the mapping includes:
mapping a first subset of addresses of the flash memory device to addresses of the LUT RAM, and
mapping a second subset of addresses of the flash memory device to addresses of the on-chip memory circuit.

18. The method of claim 17, wherein the mapping includes mapping a third subset of addresses of the flash memory device to RAM addresses of an off-chip RAM that is a storage circuit of the plurality of storage circuits.

* * * * *